US008847616B2

(12) United States Patent
Barnett

(10) Patent No.: US 8,847,616 B2
(45) Date of Patent: Sep. 30, 2014

(54) E-FIELD PROBE INTEGRATED WITH PACKAGE LID

(75) Inventor: Ron Jay Barnett, Santa Rosa, CA (US)

(73) Assignee: National Instruments Corporation, Austin, TX (US)

(*) Notice: Subject to any disclaimer, the term of this patent is extended or adjusted under 35 U.S.C. 154(b) by 363 days.

(21) Appl. No.: 13/323,102

(22) Filed: Dec. 12, 2011

(65) Prior Publication Data
US 2012/0153979 A1   Jun. 21, 2012

Related U.S. Application Data

(60) Provisional application No. 61/423,967, filed on Dec. 16, 2010.

(51) Int. Cl.
*G01R 31/302* (2006.01)
*G01R 29/08* (2006.01)
*G01R 1/07* (2006.01)
*G01R 3/00* (2006.01)

(52) U.S. Cl.
CPC ... *G01R 1/07* (2013.01); *G01R 3/00* (2013.01); *G01R 29/0878* (2013.01)

USPC .................................................. 324/754.27

(58) Field of Classification Search
None
See application file for complete search history.

(56) References Cited

U.S. PATENT DOCUMENTS 4,731,577 A * 3/1988 Logan .................. 324/750.29

* cited by examiner

*Primary Examiner* — Paresh Patel
(74) *Attorney, Agent, or Firm* — Meyertons Hood Kivlin Kowert & Goetzel, P.C.; Jeffrey C. Hood; Stephen A. Mason

(57) ABSTRACT

A measurement apparatus is disclosed. The measurement apparatus includes a lid configured to be removably affixed to a microcircuit case. One or more penetrations through the lid allow insertion of a signal-conducting probe. The probe is removably affixed to the lid at the site of the penetration. The probe includes a central conductive pin. The central conductive pin transmits to a connection outside the case a radio-frequency signal inductively received from a source inside the case. The probe also includes a dielectric region radially surrounding a portion of the central conductive pin, and a grounded outer conductive housing radially surrounding the dielectric region and electrically isolated from the central conductive pin by the dielectric region.

20 Claims, 17 Drawing Sheets

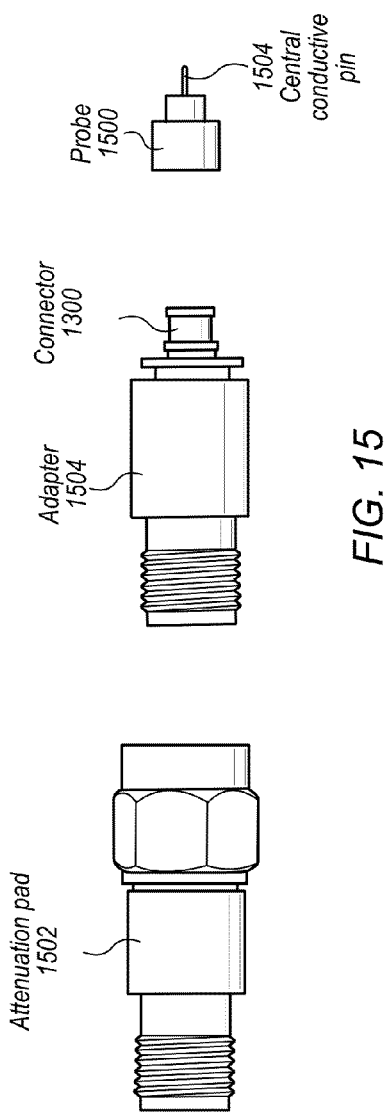
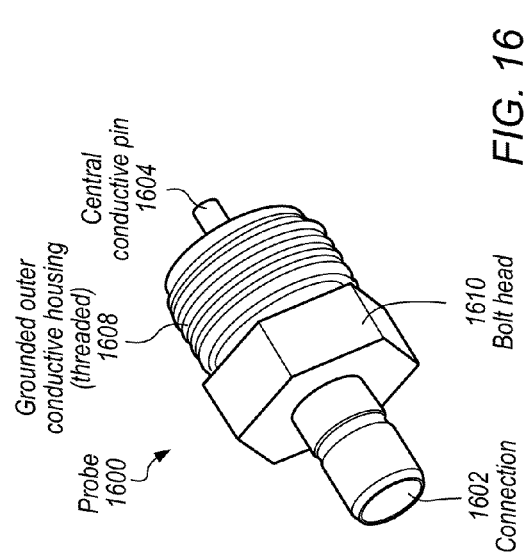
FIG. 15
FIG. 16

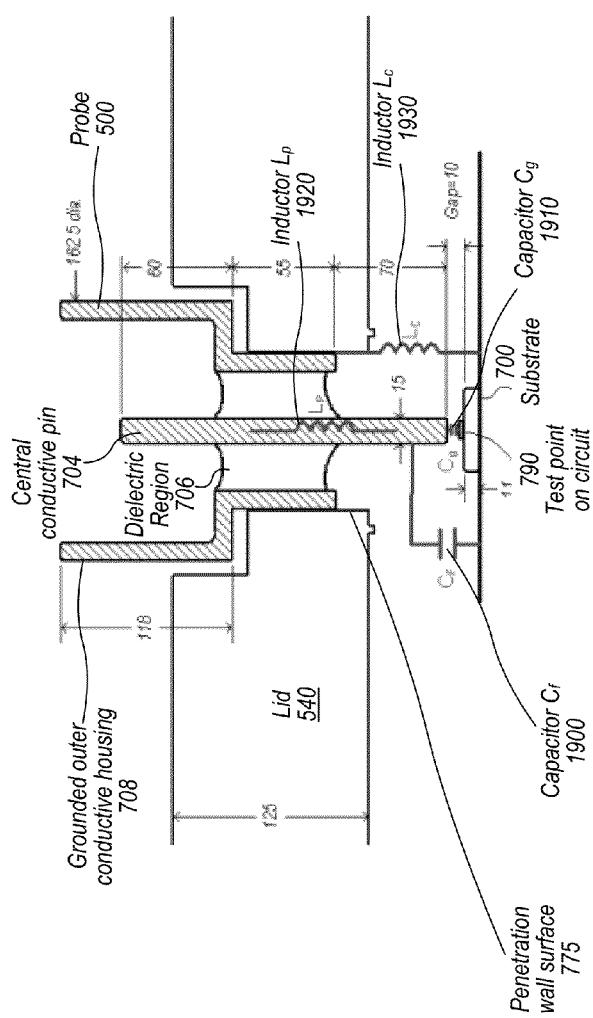
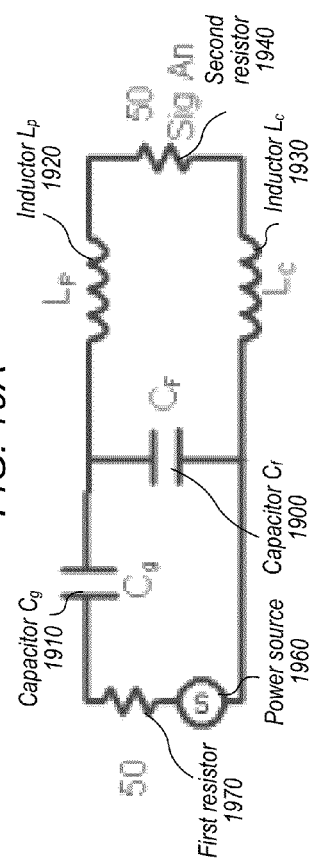
FIG. 19A
FIG. 19B

E-FIELD PROBE INTEGRATED WITH PACKAGE LID

CLAIM FOR PRIORITY TO PROVISIONAL APPLICATION

This application claims benefit of priority of U.S. Provisional Application Ser. No. 61/423,967 entitled "E-Field Probe Integrated with Package Lid" filed Dec. 16, 2010, the content of which is incorporated by reference herein in its entirety.

FIELD OF THE INVENTION

The present invention relates to the field of measurement and data acquisition systems, and more particularly to a method and apparatus for providing an e-field probe integrated with a package lid.

DESCRIPTION OF THE RELATED ART

Scientists and engineers often use measurement systems to perform a variety of functions, including measurement of physical phenomena or behavior of a unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. The measurement system can be connected to a data source, which communicates with the measurement system.

An electromagnetic field (EMF or e-field) detector is a scientific instrument for measuring electromagnetic fields. An EMF detector may serve as a data source in a measurement system. In radio frequency applications, such detectors measure the change in an electromagnetic field over time. A probe of an EMF detector acts as an antenna in radio-frequency (RF) detection, but with detection characteristics tailored to the application and the nature of the signal being detected.

SUMMARY OF THE INVENTION

An electromagnetic field detector measurement apparatus is disclosed. The measurement apparatus includes a lid configured to be removably affixed to a microcircuit case. One or more penetrations through the lid allow insertion of a signal-conducting probe. The probe is removably affixed to the lid at the site of the penetration. The probe includes a central conductive pin. The central conductive pin transmits to a connection outside the case a radio-frequency signal inductively received from a source inside the case. The probe also includes a dielectric region radially surrounding a portion of the central conductive pin, and a grounded outer conductive housing radially surrounding the dielectric region and electrically isolated from the central conductive pin by the dielectric region.

BRIEF DESCRIPTION OF THE DRAWINGS

A better understanding of the present invention can be obtained when the following detailed description of the preferred embodiment is considered in conjunction with the following drawings, in which:

FIG. 15 illustrates a side view of a connection components for use with an e-field probe according to one embodiment of the present invention;

FIG. 16 depicts a side view of an e-field probe equipped with a screw-in fitting according to one embodiment of the present invention;

FIG. 19A illustrates additional details of a cutaway view of a microcircuit case with an installed circuit and a lid fitted with an integrated e-field probe, showing circuit components representing capacitive coupling between a probe and a circuit trace according to one embodiment of the present invention;

FIG. 19B depicts circuit components representing capacitive coupling between a probe and a circuit trace according to one embodiment of the present invention;

Figure 1:
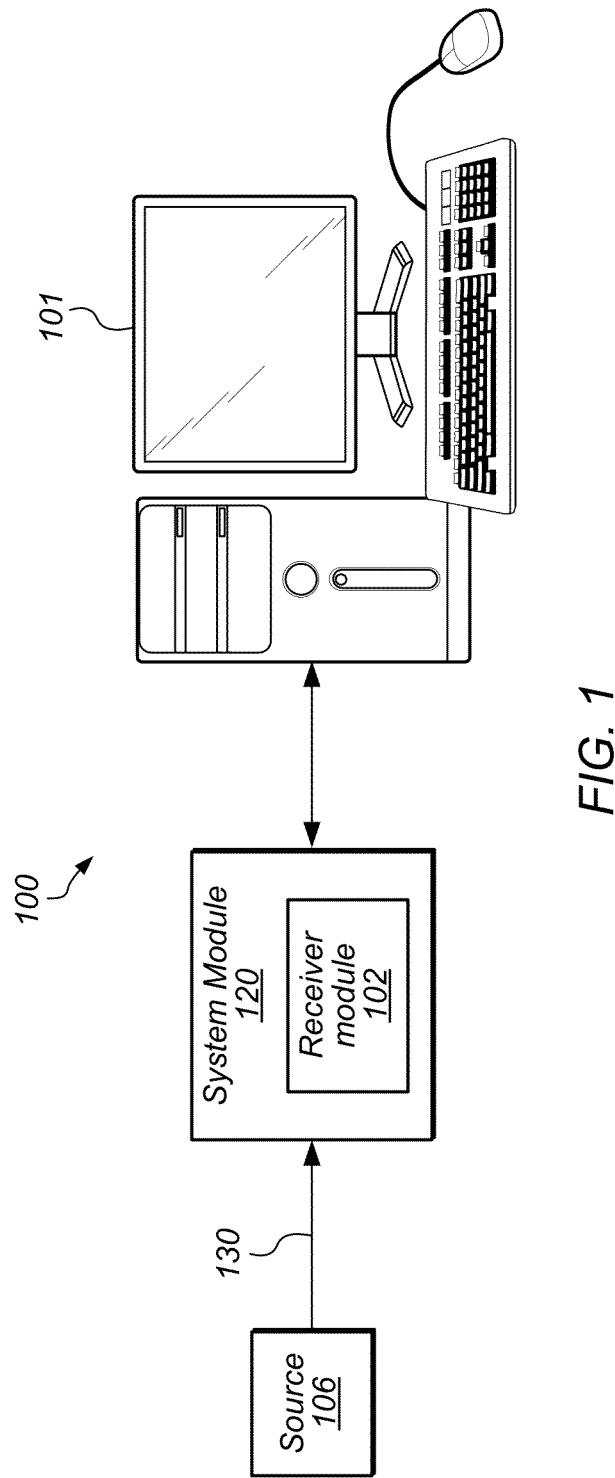
FIG. 1 illustrates a computer system configured to perform data acquisition functions compatible for use with an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Introduction to Package Lids with Integrated Radio Frequency Probes

One embodiment relates to a measurement apparatus, such as an electromagnetic field (EMF) detector. The EMF detector may be configured for inductively measuring radio-frequency signals within a microcircuit situated inside a microcircuit case. The measurement apparatus may include a lid configured to be removably affixed on a side of the microcircuit case. The lid may be affixed to the microcircuit case, in some embodiments, using bolts penetrating through the lid. One or more penetrations through the lid may allow insertion of one or more signal-conducting probes. The probes may be removably affixed to the lid at the site of the penetration.

In one embodiment, such a probe includes a central conductive pin. The central conductive pin may transmit to a connection outside the case a radio-frequency signal inductively received from a source inside the case. The central conductive pin is dimensioned to extend at full insertion of the probe within an inductive signal transmission range of a test point on a circuit inside the case without touching the circuit. In one embodiment, the lid includes an interior surface and an exterior surface and the central conductive pin extends beyond the interior surface and beyond the exterior surface.

The probe also includes a dielectric region radially surrounding a portion of the central conductive pin, and a grounded outer conductive housing radially surrounding the dielectric region and electrically isolated from the central conductive pin by the dielectric region. In one embodiment, the outer conductor grounds to the lid, which is composed of or coated in a conductive material. In one embodiment, the probe is removably affixed to the lid at the site of the penetration by friction between the outer conductor and an interior surface of the penetration. In an alternative embodiment, the probe includes a threaded barrel, and the probe is removably affixed to the lid at the site of the penetration by threads of the threaded barrel. In one embodiment, the outer conductive housing extends beyond the exterior surface but not beyond the interior surface.

FIG. 1: Data Acquisition System

FIG. 1 is a diagram of one embodiment of a computer-based measurement system or data acquisition system 100. The data acquisition system 100 may comprise a computer system 101, which may be coupled to a measurement device, e.g., an electromagnetic field detector, through a communication medium 130. The EMF detector may be a radio receiver, referred to as radio frequency (RF) receiver module 102. RF receiver module 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. RF receiver module 102 may also be an external device coupled to the computer system 101. In this embodiment, the communication medium 130 may be a serial bus, such as USB, IEEE 1394, MXI bus, Ethernet, or a proprietary bus, or a parallel bus such as GPIB or others. It is noted that the communication medium 130 may be a wired or wireless communication medium.

RF receiver module 102 may be integrated into a system module 120 coupled, to an external source 106, such as an instrument, antenna, sensor, transducer, or actuator from which RF receiver module 102 may receive an input signal, e.g., an analog input such as sensor data. In one example embodiment, source 106 is a probe integrated into a lid of a microcircuit case, as described below. In one example, the external source 106 may be a radio frequency sensor, which is comprised in a unit under test (UUT). In this example, RF receiver module 102 may receive radio frequency analog signal reading data from the radio frequency sensor and convert the analog data to digital form to be sent to the computer system 101 for analysis. Additionally, RF receiver module 102 may receive a digital input, e.g., a binary pattern, from the external source 106 (e.g., a UUT). Furthermore, the RF receiver module 102 may also produce analog or digital signals, e.g., for stimulating the UUT.

Computer system 101 may be operable to control RF receiver module 102. For example, computer system 101 may be operable to direct RF receiver module 102 to perform an acquisition, and may obtain data from RF receiver module 102 for storage and analysis therein. Additionally, the computer system 101 may be configured to send data to RF receiver module 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program RF receiver module 102 accordingly.

Exemplary Systems

Embodiments of the present invention may be involved with performing test and/or measurement functions and controlling and/or modeling instrumentation or industrial automation hardware. However, it is noted that embodiments of the present invention can be used for a plethora of applications and are not limited to the above applications. In other words, applications discussed in the present description are only examples, and embodiments of the present invention may be used in any of various types of systems. Thus, embodiments of the system and method of the present invention are configured to be used in any of various types of applications, including the operation and control of other types of devices such as multimedia devices, video devices, audio devices, telephony devices, Internet devices, radio frequency communication devices, etc.

Figure 2:
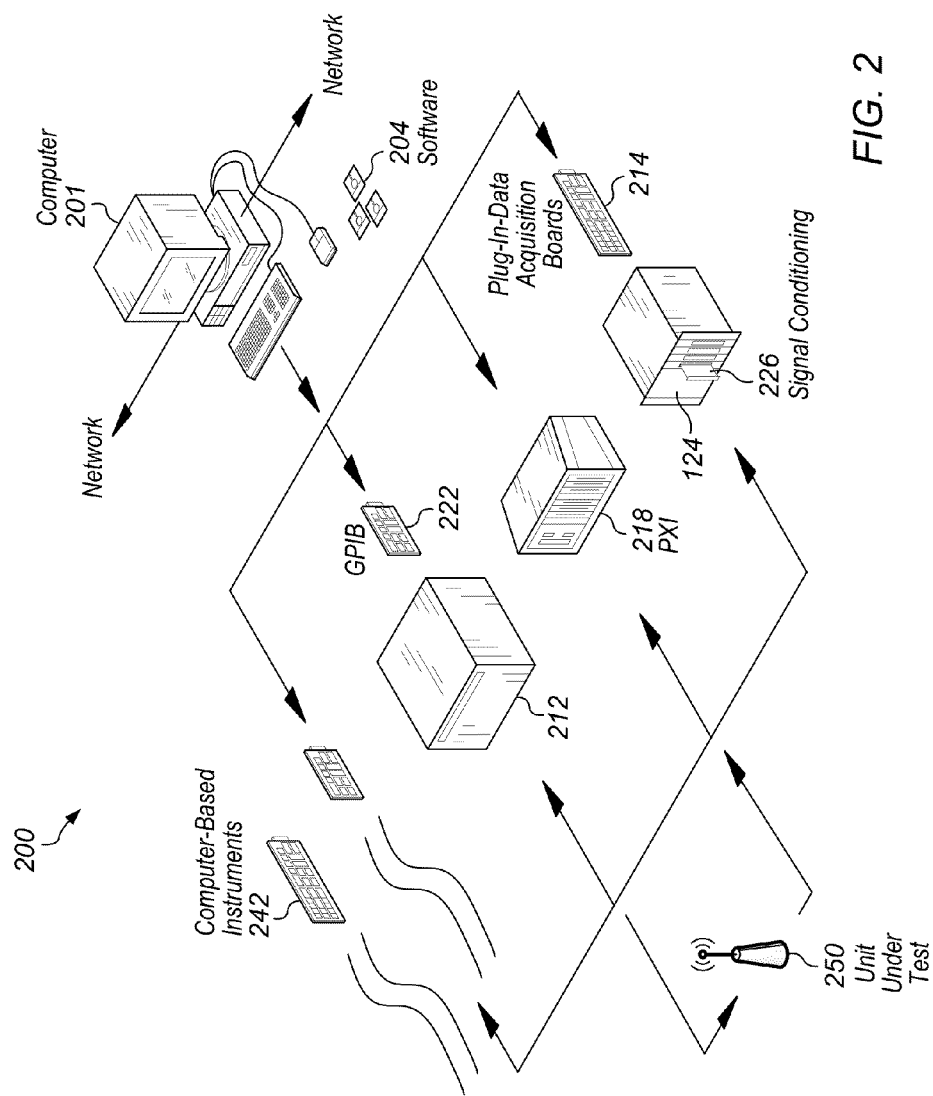
FIG. 2 depicts an instrumentation control system compatible for use with one embodiment of the invention.

FIG. 2 illustrates an exemplary instrumentation control system 200 which may implement embodiments of the invention. The system 200 comprises a host computer 201 which couples to one or more instruments. The host computer 201 may comprise a CPU, a display screen, memory, and one or more input devices such as a mouse or keyboard as shown. The computer 201 may operate with the one or more instruments to analyze, measure or control a unit under test (UUT) 250 or other process (not shown). In one embodiment, the unit under test is a microcircuit in a circuit case, as described below.

The one or more instruments may include a GPIB instrument 212 and associated GPIB interface card 222, a data acquisition board 214 inserted into or otherwise coupled with chassis 224 with associated signal conditioning circuitry 226, a PXI instrument 218, and/or one or more computer based instrument cards 242, among other types of devices. The computer system may couple to and operate with one or more of these instruments. The instruments may be coupled to the unit under test (UUT) 250 or other process, or may be coupled to receive field signals, typically generated by transducers. Prior to transmission of data to computer 201, such field signals may be processed using a filter apparatus. The system 200 may be used in a data acquisition and control application, in a test and measurement application, an image processing or machine vision application, a process control application, a man-machine interface application, a simulation application, or a hardware-in-the-loop validation application, among others.

Figure 3:
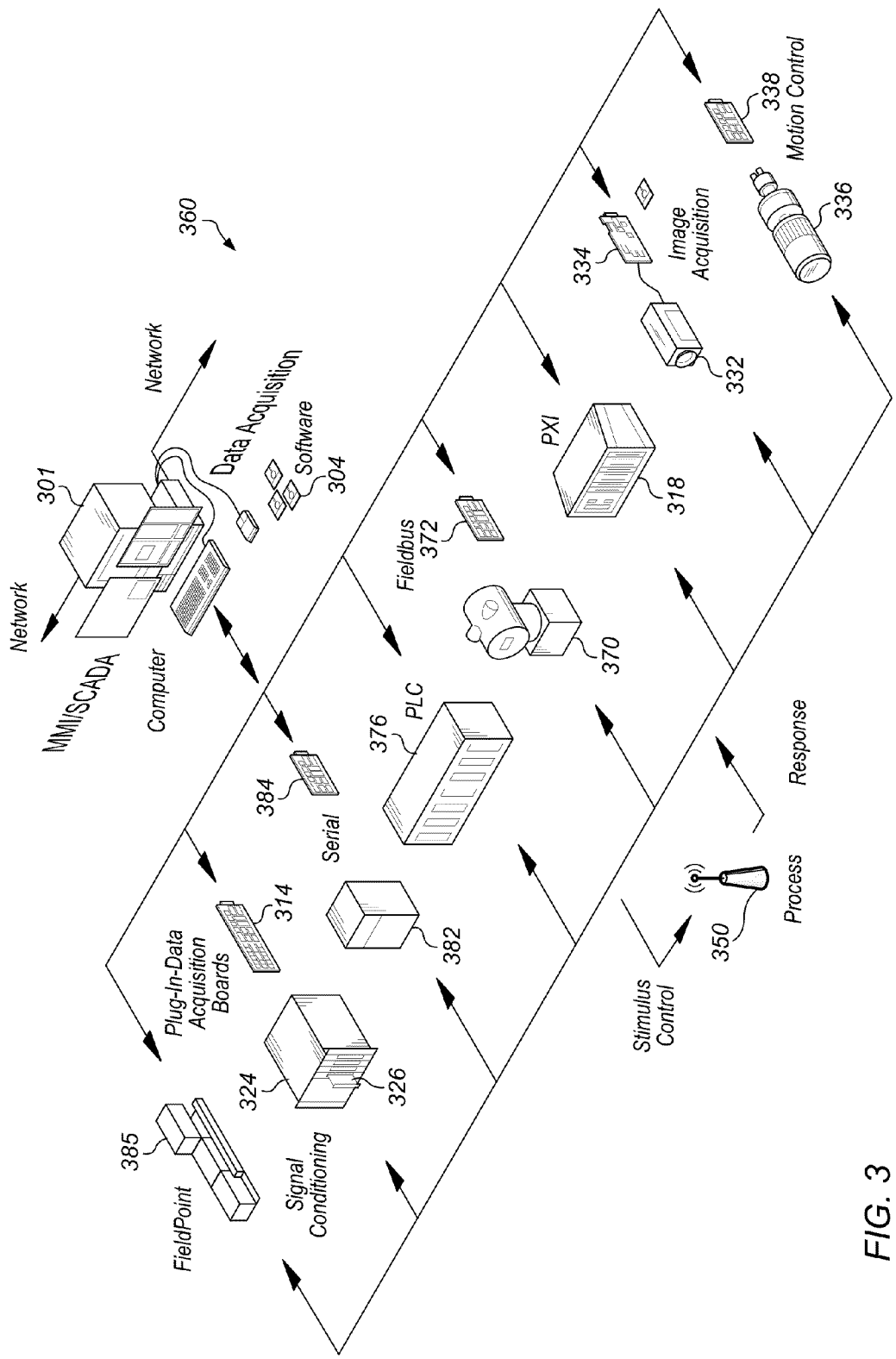
FIG. 3 illustrates an industrial automation system compatible for use with one embodiment of the invention.

FIG. 3 illustrates an exemplary industrial automation system 360 which may implement embodiments of the invention. The industrial automation system 360 is similar to the instrumentation or test and measurement system 200 shown in FIG. 2. The system 360 may comprise a computer 301 which couples to one or more devices or instruments. The computer 301 may comprise a CPU, a display screen, memory, and one or more input devices such as a mouse or keyboard as shown. The computer 301 may operate with the one or more devices to perform an automation function with respect to an RF process or device 350, such as MMI (Man Machine Interface), SCADA (Supervisory Control and Data Acquisition), portable or distributed data acquisition, process control, advanced analysis, or other control, among others.

The one or more devices may include a data acquisition board 314 inserted into or otherwise coupled with chassis 324 with associated signal conditioning circuitry 326, a PXI instrument 318, a video device 332 and associated image acquisition card 334, a motion control device 336 and associated motion control interface card 338, a fieldbus device 370 and associated fieldbus interface card 372, a PLC (Programmable Logic Controller) 376, a serial instrument 382 and associated serial interface card 384, or a distributed data acquisition system, such as the Fieldpoint system available from National Instruments, among other types of devices. The computer system may couple to and operate with one or more of these devices. The instruments may be coupled to the RF process or device 350, or may be coupled to receive field signals, typically generated by transducers. Prior to transmission of data to computer 301, such field signals may be processed using a filter apparatus.

FIGS. 4-16 depict various embodiments of an EMF measurement apparatus for inductively measuring radio-frequency signals within a microcircuit situated inside a microcircuit case and also depict various embodiments of components of that measurement apparatus. For example, FIGS. 4-16 may depict various exemplary embodiments of receiver module 102 of FIG. 1.

Figure 4:
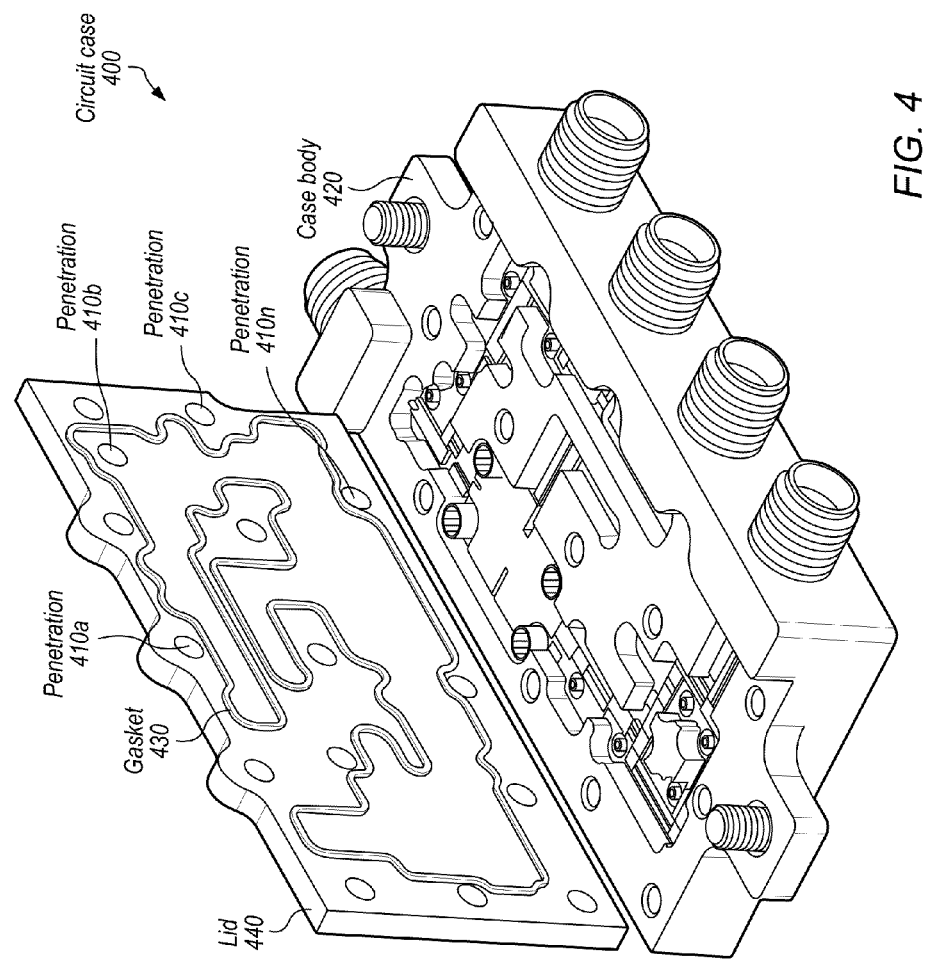
FIG. 4 depicts a receiver module case including a lid with penetrations for accommodating e-field probes according to one embodiment of the present invention.

FIG. 4 depicts a receiver module case including a lid with a penetration for accommodating e-field probes according to one embodiment of the present invention. A circuit case includes a case body 420 and a lid 440 with penetrations 410a-410n. In one embodiment, lid 440 affixes to case body 420 by means of bolts (not shown) extending through one or more of penetrations 410a-410n. In some embodiments, lid 440 also includes a gasket 430 for sealing to case body 420. One or more of penetrations 410a-410n, such as penetration 410b, is designed to accommodate a probe (not shown) for transmitting to a connection outside circuit case 400 a radio-frequency signal inductively received from a source inside circuit case 400, such as a circuit (not shown).

When affixed to case body 420 with circuit (not shown) housed inside case body 420 and a probe (not shown) affixed in one of penetrations 410a-410n, lid 440 fixes an end of the probe at a constant distance above a point on the circuit for repeatably measuring radio-frequency alternating current signals coming from the circuit with a minimal risk of damage to the circuit. When the lid is affixed, the measuring is performed in an environment that more closely models the operating environment of the circuit (e.g., operating with a lid on) than could be accomplished in previous measurement techniques (e.g., those which usually required the lid off to allow movement of a freely-movable probe).

As discussed below, FIGS. 5-10 illustrate the combination of various components of the apparatus, including the lid and probes, as well as interaction of a lid and probes with a microcircuit inside a microcircuit case.

Figure 5:
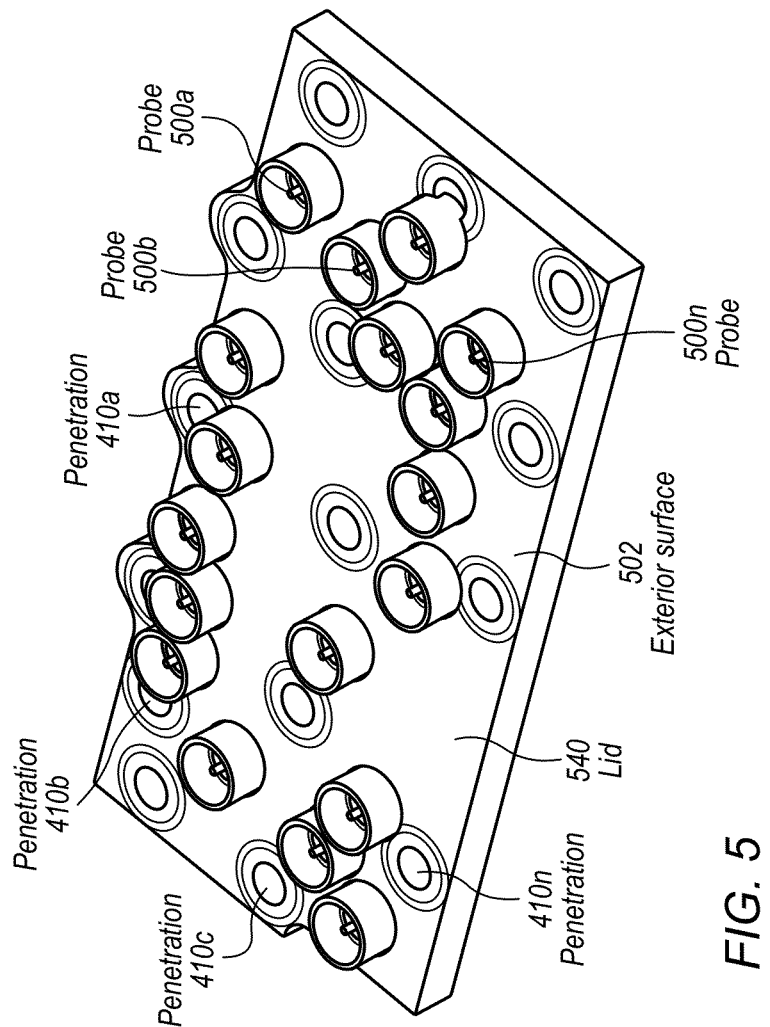
FIG. 5 illustrates a top view of a lid of a microcircuit case fitted with integrated e-field probes according to one embodiment of the present invention.

FIG. 5 illustrates a top view of a lid of a microcircuit case lid fitted with integrated e-field probes according to one embodiment of the present invention. Lid 540 includes one or more penetrations 410a-410n, into which are inserted probes 500a-500n. In the embodiment depicted in FIG. 5, each of probes 500a-500n extends beyond an exterior surface 502 of lid 540, such that both a central conductive pin 504 and a grounded outer conductive housing 508 of probe 500a extend beyond exterior surface 502. In the configuration shown in FIG. 5, probes 500a-500n extend beyond exterior surface 502 of lid 540 to allow connection of cabling or cabling adapters to transmit signals received from a circuit inside a case to which lid 540 is affixed (not shown) to measurement devices outside of the case to which lid 540 is attached (also not shown). Thus, cabling may be connected to both central conductive pin 504 and a grounded outer conductive housing 508 of probe 500a for signal transmission as described above.

Figure 6:
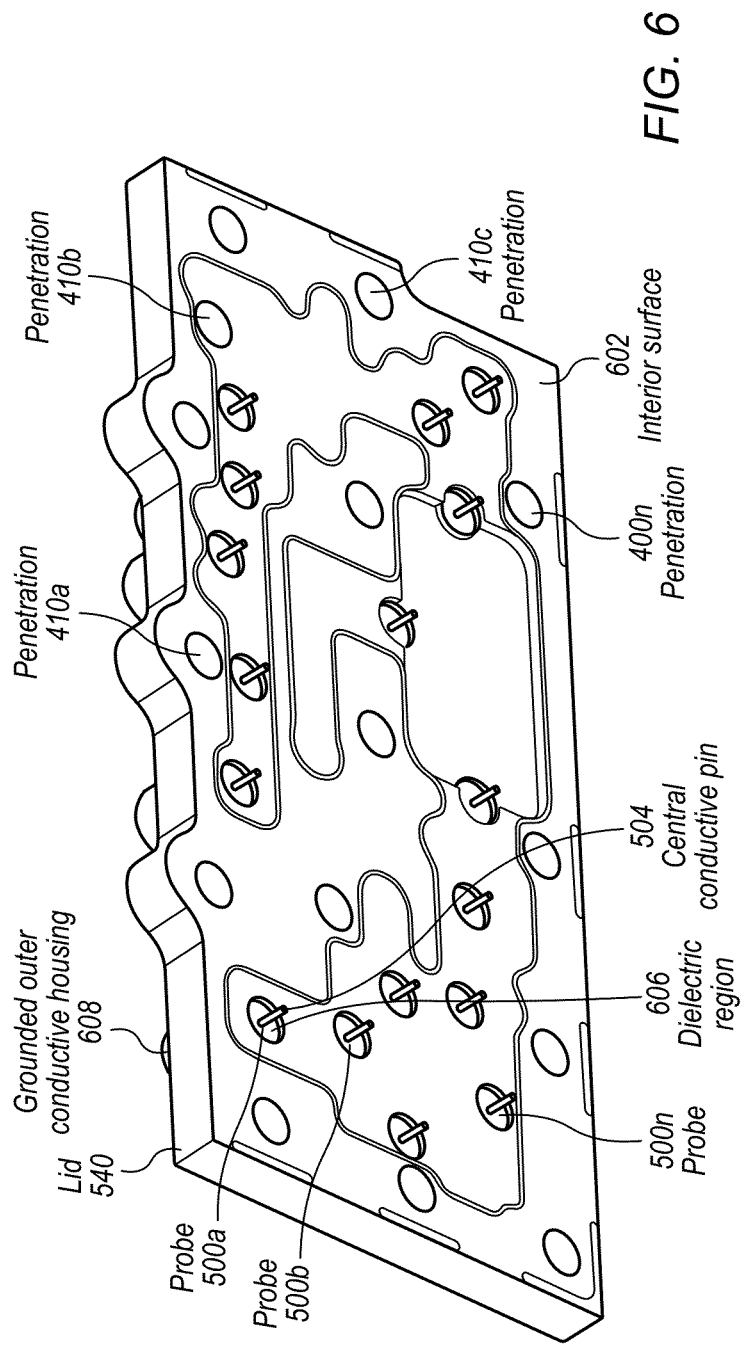
FIG. 6 depicts a bottom view of a lid of a microcircuit case lid fitted with integrated e-field probes according to one embodiment of the present invention.

FIG. 6 depicts a bottom view of a lid of a microcircuit case lid fitted with integrated e-field probes according to one embodiment of the present invention. As discussed above, lid 540 includes one or more penetrations 410a-410n, into which are inserted probes 500a-500n. An interior surface 602 of lid 540 is visible in FIG. 6, and a central conductive pin 504, which is radially surrounded by a dielectric region 606 along a portion of the length of central conductive pin 504, extends beyond interior surface 602. In the embodiment pictured in FIG. 6, dielectric region 606 and grounded outer conductive housing 608 do not extend beyond interior surface 602. As a result of the configuration displayed in FIG. 6, penetrations 410a-410n hold probes 500a-500n in relatively fixed positions relative to a circuit in a case to which lid 540 is attached (not shown). An individual probe, such as probe 500a, is held in a fixed position by contact between grounded conductive housing 608 and a penetration, with the result that central conductive pin 504 at a relatively constant height over a fixed point on a circuit during measurement. The ability to hold central conductive pin 504 is held at a relatively constant height over a fixed point on a circuit during measurement reduces the risk of damage to a circuit and increases the likelihood of repeatable measurements.

Figure 7:
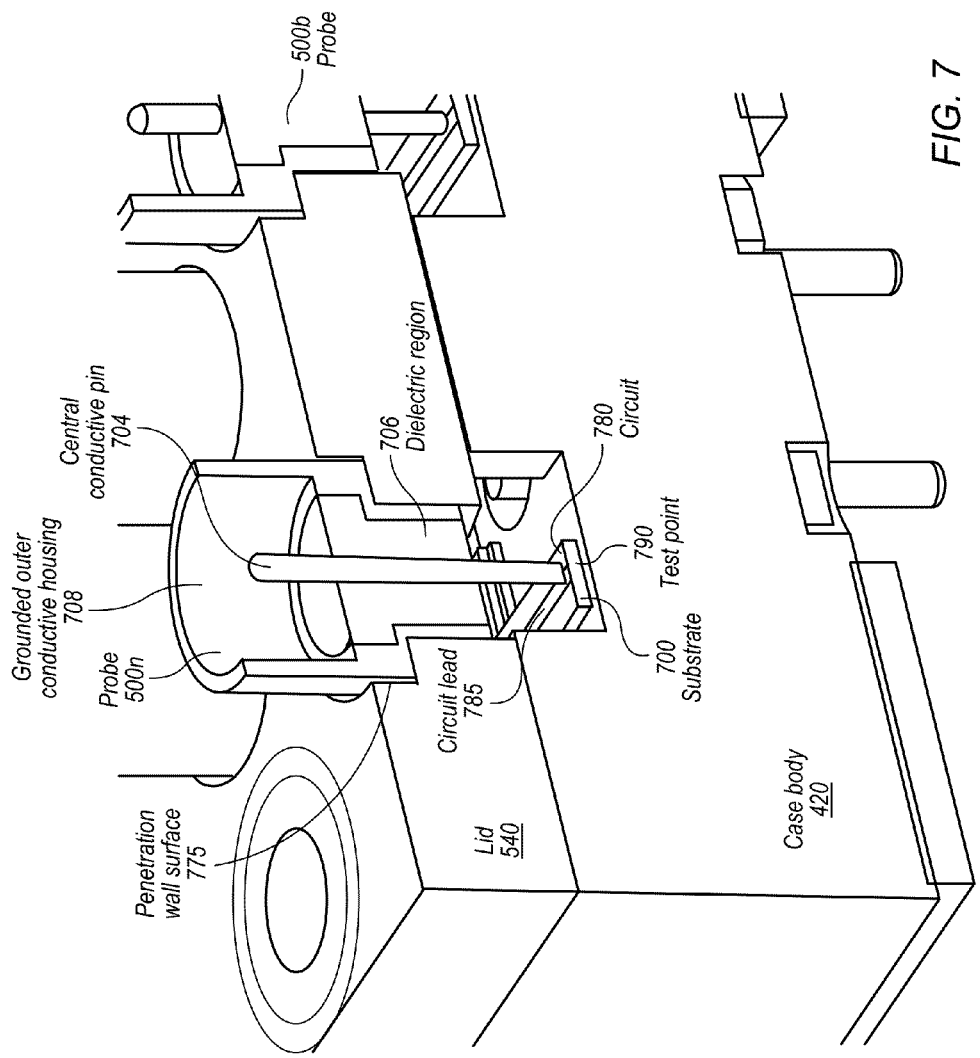
FIG. 7 illustrates a cutaway view of a microcircuit case with an installed circuit and a lid fitted with integrated e-field probes according to one embodiment of the present invention.

FIG. 7 illustrates a cutaway view of microcircuit case with an installed circuit and a lid fitted with integrated e-field probes according to one embodiment of the present invention. Probe 500n is affixed in a penetration of lid 540 by friction between a penetration wall surface 775 and grounded outer conductive housing 708. A central conductive pin 704 is electrically isolated from grounded outer conductive housing 708 by a dielectric region 706. At full insertion of probe 500n in lid 540, central conductive pin 704 is positioned over a test point 790 on a circuit lead 785 resting on a substrate 700 of a circuit 780 installed within case body 420. Thus, a current flowing through test point 790 may be inductively detected in central conductive pin 704 and transmitted beyond lid 540 to a measurement apparatus (not shown) for measurement. Because a distance between probe 500n and a probe 500b is several orders of magnitude larger than the distance between central conductive pin 704 and test point 790, crosstalk between signals transiting probe 500n and probe 500b presents minimal interference with transmission to central conductive pin 704 of a signal transiting test point 790. Relevant dimensions are provided in FIG. 9, discussed below.

Figure 8:
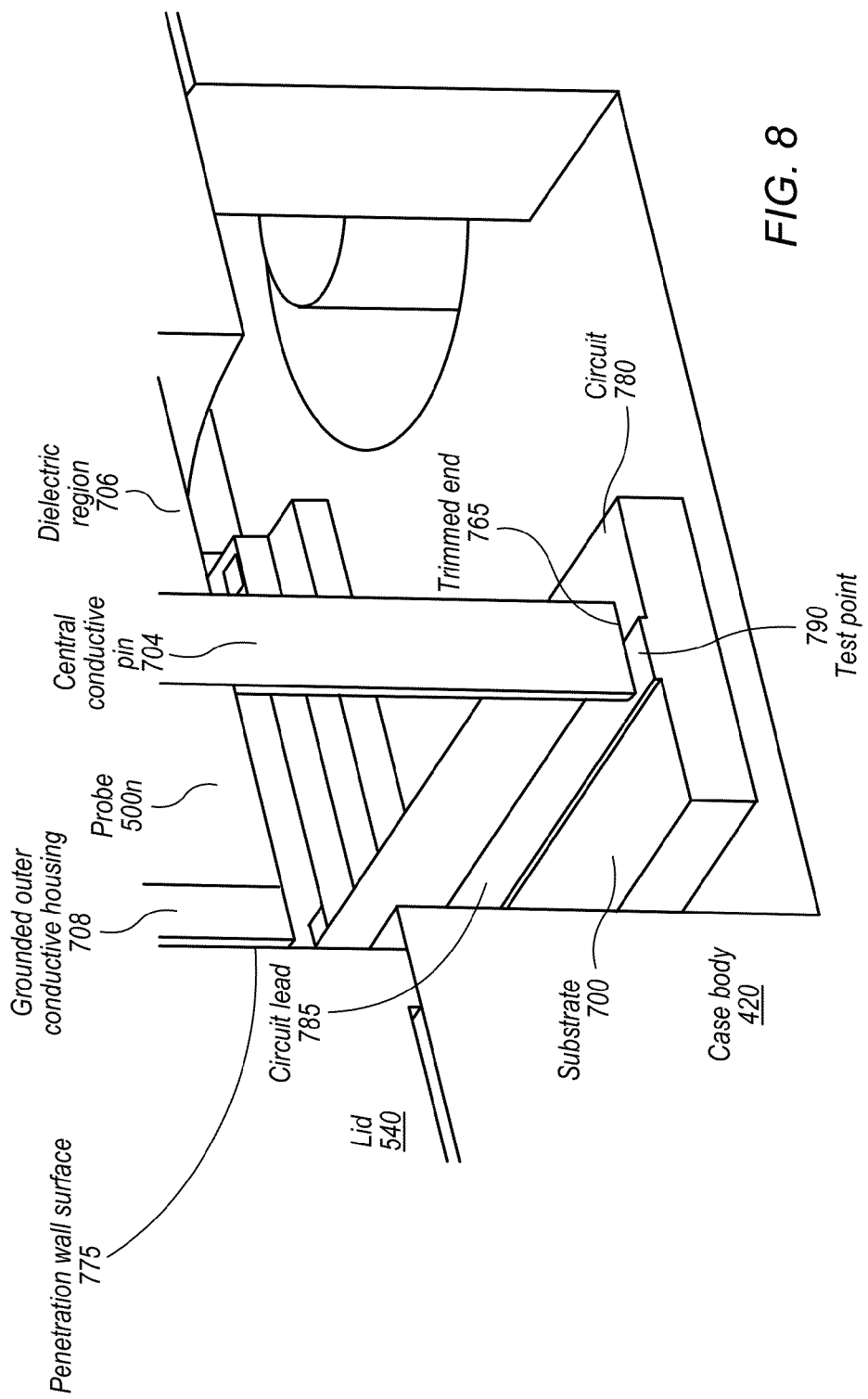
FIG. 8 depicts additional details of a cutaway view of a microcircuit case with an installed circuit and a lid fitted with integrated e-field probes according to one embodiment of the present invention.

FIG. 8 depicts additional details of a cutaway view of a microcircuit case with an installed circuit and a lid fitted with integrated e-field probes according to one embodiment of the present invention. As described above, probe 500n is affixed in a penetration of lid 540 by friction between a penetration wall surface 775 and grounded outer conductive housing 708. A central conductive pin 704 is electrically isolated from grounded outer conductive housing 708 by a dielectric region 706. At full insertion of probe 500n in lid 540, a trimmed end 765 of central conductive pin 704 is positioned over a test point 790 on a circuit lead 785 resting on a substrate 700 of a circuit 780 installed within case body 420 such that a distance between trimmed end 765 of central conductive pin 704 and test point 790 is held constant. The trimming of central pin 704 to create trimmed end 765 helps to ensure a small distance between central conductive pin 704 and test point 790 while at the same time ensuring that central conductive pin 704 does not make destructive contact with circuit lead 785. Trimming of central pin 704 to create trimmed end 765 is discussed below with respect to FIG. 18.

Figure 9:
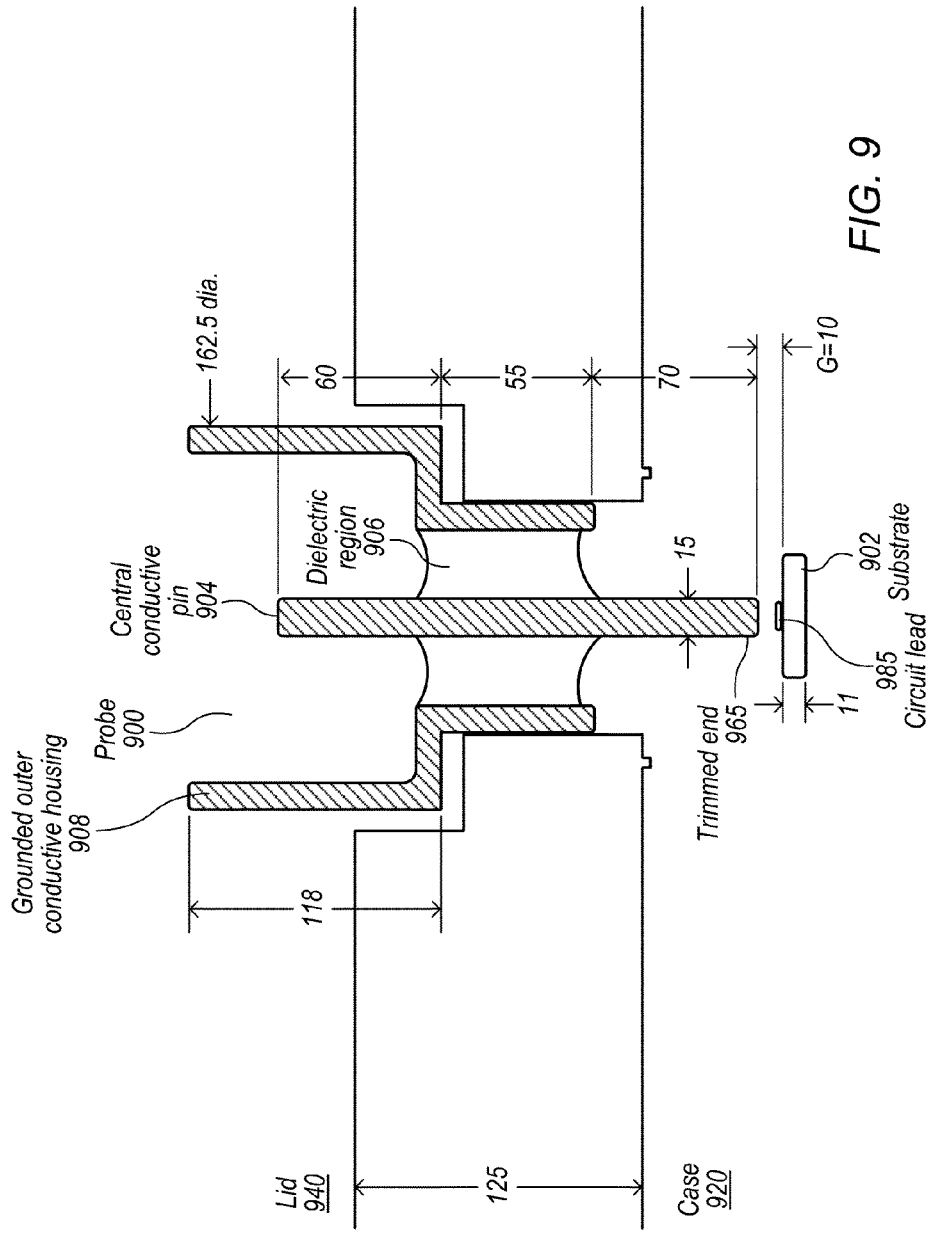
FIG. 9 illustrates fabrication details of a microcircuit case with an installed circuit and a lid fitted with integrated e-field probes according to one embodiment of the present invention.

FIG. 9 illustrates fabrication details of microcircuit case with an installed circuit and a lid fitted with integrated e-field probes according to one embodiment of the present invention. Probe 900 is shown as inserted into lid 940 such that grounded outer conductive housing 908 is held in a fixed position by friction between probe 900 and lid 940, maintaining a fixed distance between trimmed end 965 of central conductive pin 904 and circuit lead 985 resting on substrate 902 inside case body 920. A dielectric region 906 electrically isolates central conductive pin 904 from grounded outer conductive housing 908. Measurements for fabricating probe 900 and lid 940 for use with a case 920 housing a circuit lead 965 on a substrate 902 as described in FIG. 9 are provided. The dimensions selected are one embodiment of design decisions made to ensure a small distance between central conductive pin 904 and circuit lead 985 while at the same time ensuring that central conductive pin 904 does not make destructive contact with circuit lead 985.

Figure 10:
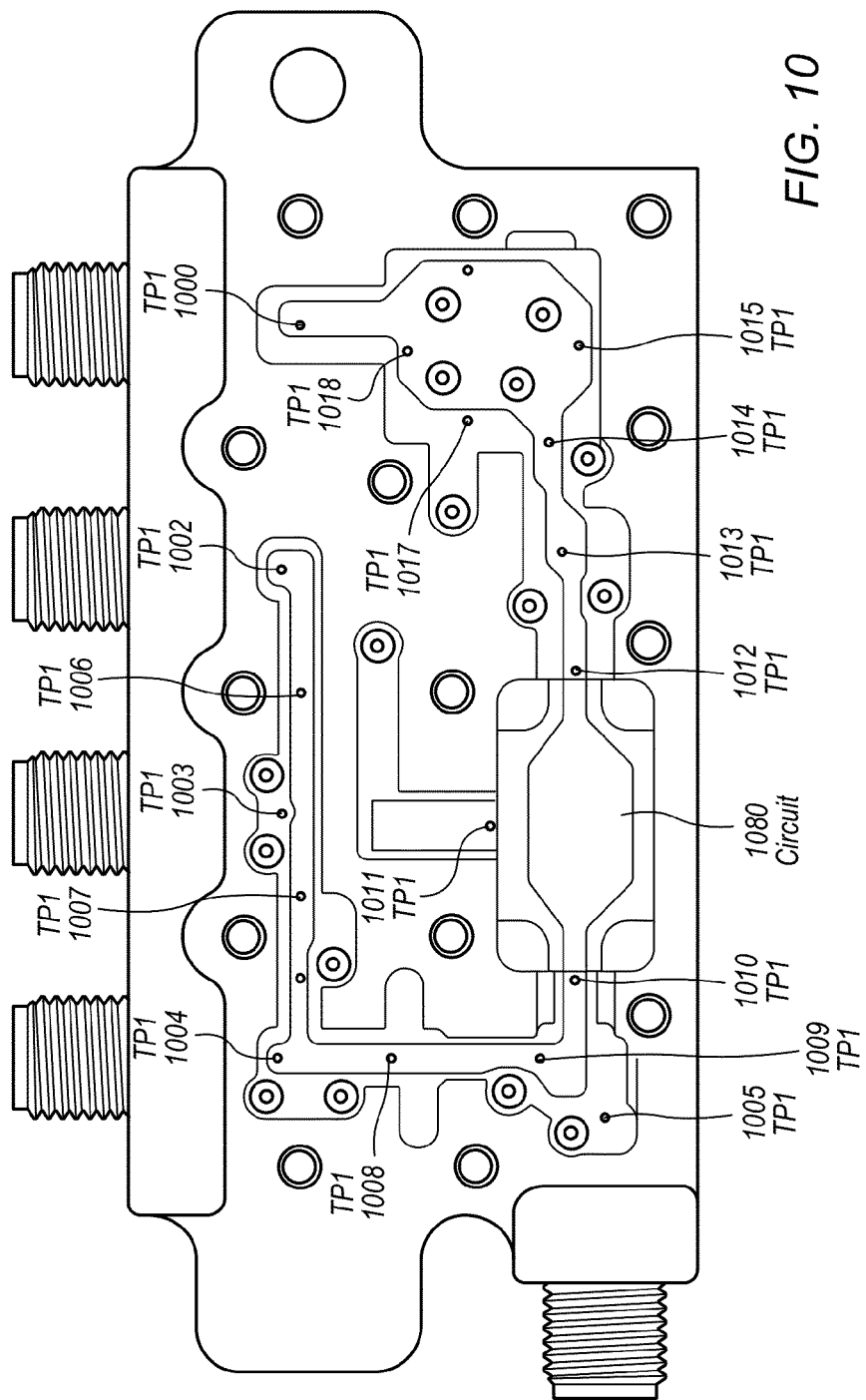
FIG. 10 depicts a schematic view of a microcircuit case with an installed circuit and a lid fitted with integrated e-field probes for testing at depicted test points according to one embodiment of the present invention.

FIG. 10 depicts a schematic view of a microcircuit case with an installed circuit and a lid fitted with integrated e-field probes for testing at depicted test points according to one embodiment of the present invention. A circuit 1080 is shown with test points 1000-1032. Using the lid with integrated probes described above, currents at test points 1000-1032 are measured. Specifically, test points 1000-1032 represent fixed points on circuit 1080 with respect to which the currents flowing through circuit 1080 are of interest. In one embodiment, the responses of circuit 1080 at test points 1000-1032 are recorded and compared either to expected values or to previously measured values for circuit 1080 or similar circuits. Comparing the values at one or more of test points 1000-1032 to calculated or previously recorded data, embodiments allows=users to determine whether circuit 1080 is performing within expected specifications. Additionally, in some embodiments, comparing the values at one or more of test points 1000-1032 to calculated or previously recorded data, embodiments allow users to diagnose the source of a failure in circuit 1080.

Figure 11:
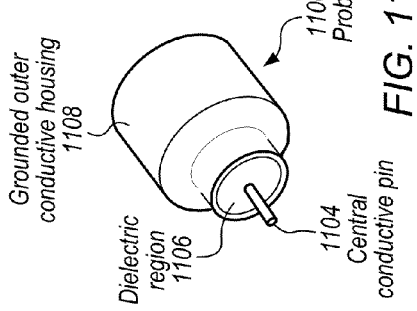
FIG. 11 illustrates a side view of an e-field probe according to one embodiment of the present invention.

FIG. 11 illustrates a side view of an e-field probe according to one embodiment of the present invention. Probe 1100 has a grounded outer conductive housing 1108 separated and electrically isolated from a central conductive pin 1104 by a dielectric region 1106. As discussed herein, references to grounded outer conductive housing 1108 as being "grounded" refer to the electrical condition of grounded outer conductive housing 1108 during operation as part of an apparatus for measuring currents as described above.

Figure 12:
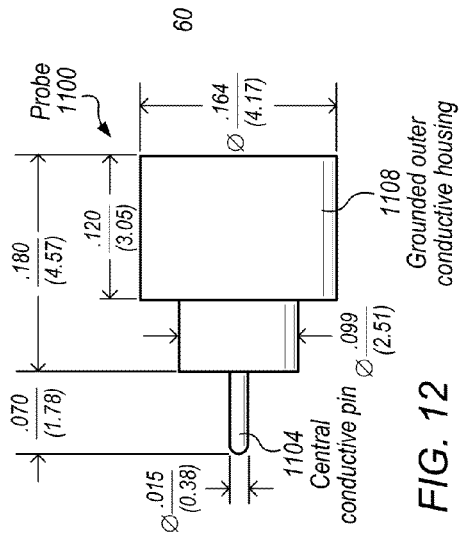
FIG. 12 depicts fabrication details of an e-field probe according to one embodiment of the present invention.

FIG. 12 depicts fabrication details of an e-field probe according to one embodiment of the present invention. External dimensions are provided for grounded outer conductive housing 1108 and central conductive pin 1104 of probe 1100. In one embodiment, the length indicated for central conductive pin 1104 is achieved by placing probe 1100 over a length template (not shown) and shaving or dressing any material from central conductive pin 1104 that extends beyond the bottom of the length template. In some embodiments, probe 1100 is mounted in a lid (not shown) with multiple other probes and multiple central conductive pins are dressed simultaneously. Such a length template can also be used as a storage device for storing a lid with probes installed in the lid.

As discussed below, FIGS. 13-16 depict components of probes and their connections to a measurement device suitable for use in embodiments of a measurement apparatus for inductively measuring radio-frequency signals within a microcircuit situated inside a microcircuit case.

Figure 13:
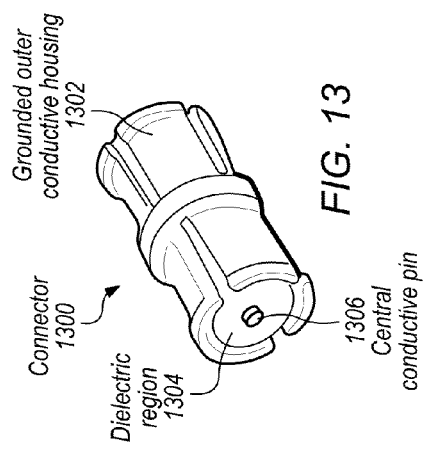
FIG. 13 illustrates a side view of a connector for connecting to an e-field probe according to one embodiment of the present invention.

FIG. 13 illustrates a side view of a connector for connecting to an e-field probe according to one embodiment of the present invention. Connector 1300 has a grounded outer conductive housing 1302 and a dielectric region electrically isolating grounded outer conductive housing 1304 from central conductive pin 1306.

Figure 14:
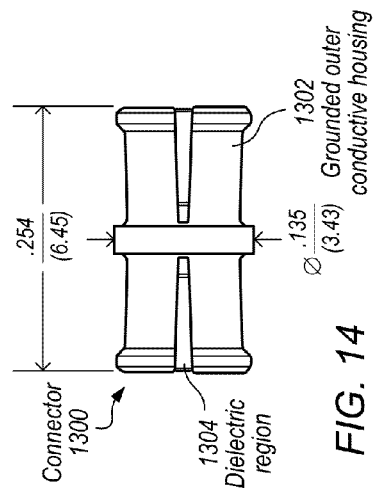
FIG. 14 depicts fabrication details of a connector for connecting to an e-field probe according to one embodiment of the present invention.

FIG. 14 depicts fabrication details of a connector for connecting to an e-field probe according to one embodiment of the present invention. Dimensions are provided for grounded outer conductive housing 1302 of connector 1300 and dielectric region 1304 is visible.

FIG. 15 illustrates a side view of connection components for use with an e-field probe according to one embodiment of the present invention. An attenuation pad 1502 for transmitting to a measurement instrument a signal received by central conductive pin 1504 of probe 1500 is connected to probe 1500 through connector 1300 and an adapter 1504.

FIG. 16 depicts a side view of an alternative embodiment of an e-field probe equipped with a screw-in fitting. Probe 1600 includes a connection 1602 for transmitting to a measurement instrument a signal received by central conductive pin 1604 of probe 1600. A grounded outer conductive housing 1608 is threaded for threaded insertion into a lid (not shown) and fitted with a bolt-head 1610 for application of a torque at insertion to secure probe 1600 to a lid (not shown) at a repeatable depth of insertion using a repeatable force.

Figure 17:
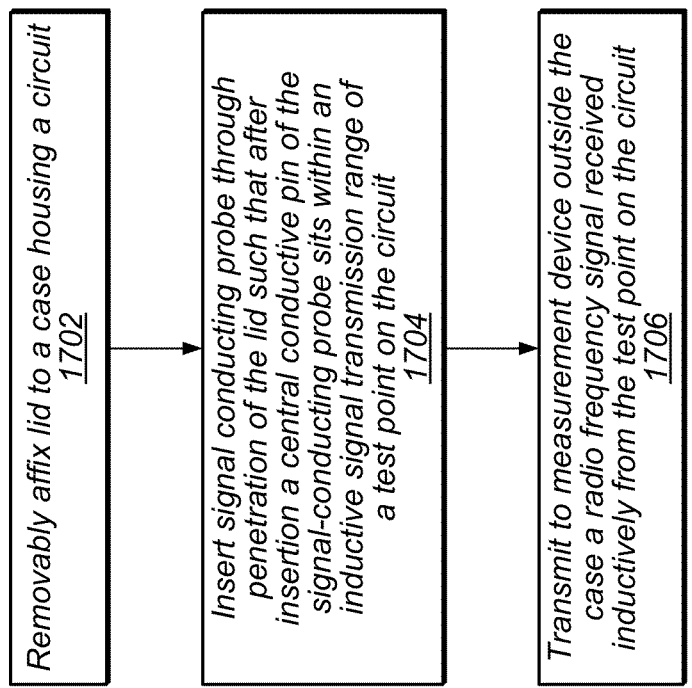
FIG. 17 illustrates a method for using a microcircuit case lid with an integrated e-field probe according to one embodiment of the present invention.

As discussed below, FIGS. 17-18 discuss methods and techniques for making and using embodiments of a measurement apparatus for inductively measuring radio-frequency signals within a microcircuit situated inside a microcircuit case FIG. 17 illustrates a method for using a microcircuit case lid with an integrated e-field probe according to one embodiment of the present invention. A lid is removably affixed to a case housing a circuit (block 1702). As discussed above, in one embodiment, a lid is removably affixed using bolts placed through lid penetrations. In another embodiment, a lid may friction-fit or snap into a case. A signal conducting probe is inserted through a penetration of the lid such that after insertion a central conductive pin of the signal-conducting probe sits within an inductive signal transmission range of a test point on the circuit (block 1704). As alluded to above, methods of probe insertion will vary between embodiments. Friction fit probes, such as those discussed above with respect to FIGS. 5-9, will provide one means of insertion at a fixed position. A screw-in probe, such as that discussed above with respect to FIG. 16, provides an alternative means of insertion at a fixed position. Further, as one skilled in the art will readily realize in light of having read the present disclosure, the operations discussed above with respect to block 1704 and block 1702 may be performed in any order. A lid containing probes may be placed on a case or probes may be placed in a lid on a case. A radio frequency signal received inductively from the test point on the circuit is transmitted to a measurement device outside the case (block 1706).

Figure 18:
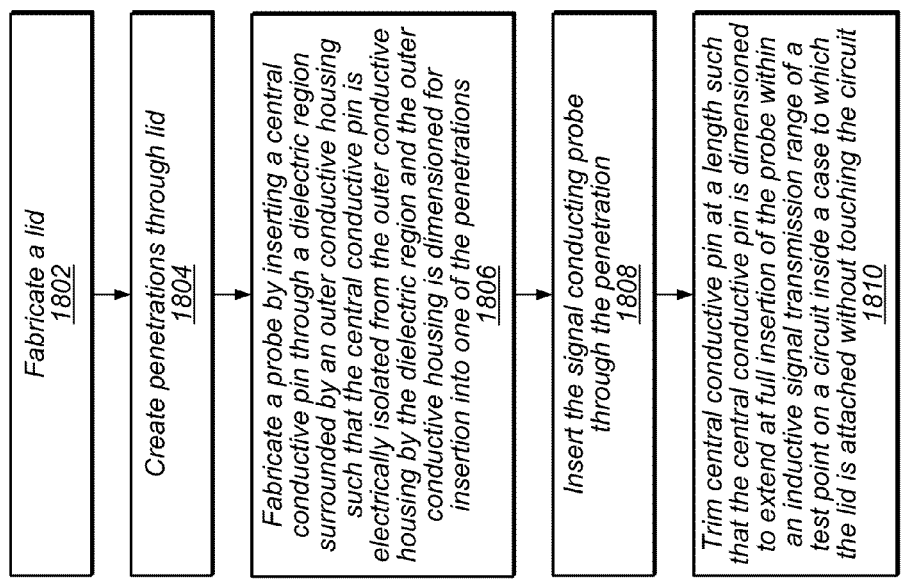
FIG. 18 depicts a method for fabricating a microcircuit case lid with an integrated e-field probe according to one embodiment of the present invention.

FIG. 18 depicts a method for fabricating a microcircuit case lid with an integrated e-field probe according to one embodiment of the present invention. A lid is fabricated (block 1802). In one embodiment, as portrayed in FIG. 9 above, the lid is composed of an aluminum alloy that is subsequently coated in gold. Penetrations through the lid are created (block 1804). A probe is fabricated by inserting a central conductive pin through a dielectric region surrounded by an outer conductive housing such that the central conductive pin is electrically isolated from the outer conductive housing by the dielectric region and the outer conductive housing is dimensioned for insertion into one of the penetrations (block 1806). The signal conducting probe is inserted through the penetration (block 1808). The central conductive pin is trimmed at a length such that the central conductive pin is dimensioned to extend at full insertion of the probe within an inductive signal transmission range of a test point on a circuit inside a case to which the lid is attached without touching the circuit (block 1810).

FIG. 19A illustrates additional details of a cutaway view of a microcircuit case with an installed circuit and a lid fitted with an integrated e-field probe, showing circuit components representing capacitive coupling between a probe and a circuit trace according to one embodiment of the present invention. Probe 500 is affixed in a penetration of lid 540 by friction between a penetration wall surface 775 and grounded outer conductive housing 708. A central conductive pin 704 is electrically isolated from grounded outer conductive housing 708 by a dielectric region 706. At full insertion of probe 500 in lid 540, central conductive pin 704 is positioned over a test point on a circuit lead 790 resting on a substrate 700.

Thus, a signal flowing along a conductive trace through test point 790 results in a potential underneath central conductive pin 704 that is measured by way of a coupling between central conductive pin 704 and test point 790. The total coupling from test point 790 to conductive pin 704 is modeled in a manner as a circuit containing a capacitor $C_f$ 1900, a capacitor $C_g$ 1910, an inductor $L_p$ 1920, and an inductor $L_C$ 1930.

FIG. 19B depicts circuit components representing capacitive coupling between a probe and a circuit trace according to one embodiment of the present invention. A signal modeled by power source 1960 and a first resistor 1970 is coupled through capacitor $C_g$ 1910 to capacitor $C_f$ 1900 and inductor $L_p$ 1920. Inductor $L_p$ 1920 additionally connects to a sensing device modeled by second resistor 1940, which is connected to inductor $L_C$ 1930. Inductor $L_C$ 1930 connects to both power source 1960 and capacitor $C_F$ 1900.

Figure 20:
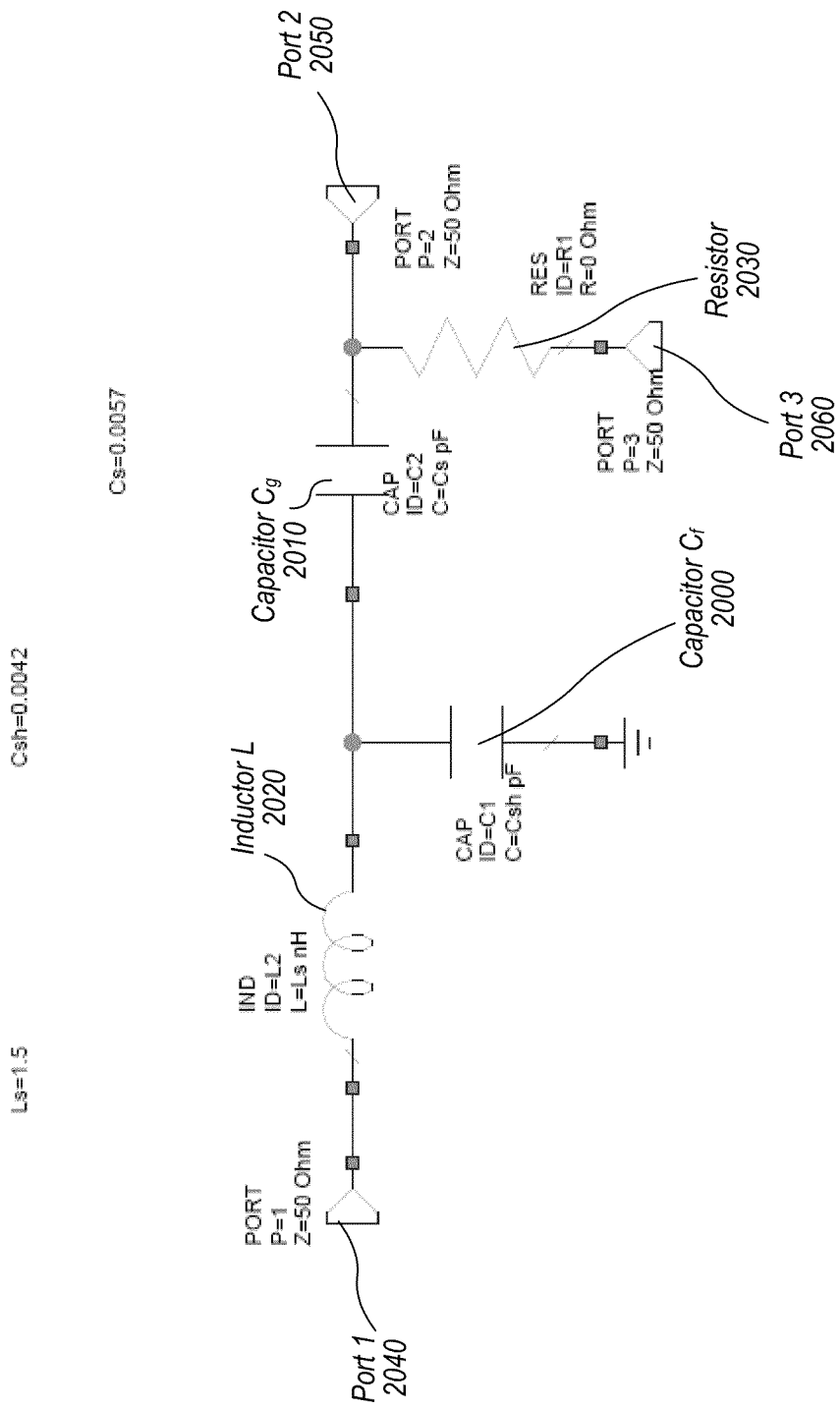
FIG. 20 illustrates circuit components representing capacitive coupling between a probe and a circuit trace according to one embodiment of the present invention.

FIG. 20 illustrates circuit components representing an electrical model of capacitive coupling between a probe and a circuit trace according to one embodiment of the present invention. Inductor L 2020 is connected to capacitor $C_f$ 2000 and capacitor $C_g$ 2010, which connects to resistor 2030. Thus, a signal enters port 2 2050 and exits port 3 2060, and the signal is measured through port 1 2040.

Figure 21:
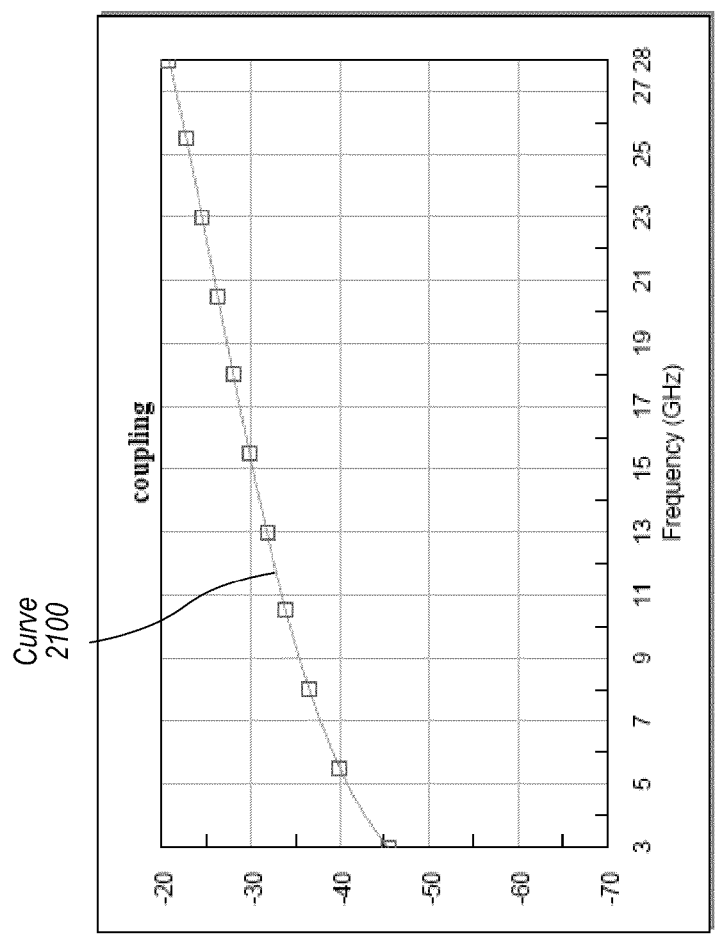
FIG. 21 depicts a frequency response chart illustrating behavior of circuit components representing capacitive coupling between a probe and a circuit trace according to one embodiment of the present invention.

FIG. 21 depicts a frequency response chart illustrating behavior of circuit components representing capacitive coupling between a probe and a circuit trace according to one embodiment of the present invention. Curve 2100 illustrates that coupling increases with signal frequency.

Although the embodiments above have been described in considerable detail, numerous variations and modifications will become apparent to those skilled in the art once the above disclosure is fully appreciated. It is intended that the following claims be interpreted to embrace all such variations and modifications. Specifically, while the description above focuses on an example that uses a probe attached to a case housing a microcircuit, the principles described herein apply to any of a wide variety of probe types that may be inserted into a wide variety of housings to detect a wide variety of signals (e.g., ionizing radiation or photons from a particle-generating source in an isolating environment as an alternative to electromagnetic fields and inductive currents) and one skilled in the art will realize, in light of having read the present disclosure, that such probes and environments fall within the scope and intent of the present disclosure. While the probe described herein is described as an electrical probe, one of skill in the relevant art will realize that probes applying the principles described herein will find use in a wide range of applications ranging from radiation detection to fiber optics. The methods and techniques described herein may prove advantageous in any context in which a probe is inserted into a case to determine measurements from sources inside the case.

Furthermore, the principles described herein are not limited to RF signals in electrical sources. For example, certain embodiments within the scope of the present disclosure may be used for measuring DC electromagnetic fields. Further, while the disclosure above focuses on an example of friction-fit probe insertion and lids affixed using bolts, it should be noted that the techniques and methods described herein apply broadly to probes and lids having any of a wide variety of coupling mechanisms.

I claim:

1. A measurement apparatus, the measurement apparatus comprising:
   a lid, wherein the lid comprises one or more penetrations through the lid; and
   a signal-conducting probe insertable through a penetration of the one or more penetrations, wherein
      the probe is removably affixed to the lid at the site of the penetration, and
      the probe comprises:
         a central conductive pin, wherein the central conductive pin transmits to a connection outside a case to which the lid is removably affixed a radio-frequency signal inductively received from a source inside the case, wherein the central conductive pin is dimensioned to extend at full insertion of the probe within an inductive signal transmission range of a test point on a circuit inside the case without touching the circuit;
         a dielectric region radially surrounding a portion of the central conductive pin, and
         a grounded outer conductive housing radially surrounding the dielectric region and electrically isolated from the central conductive pin by the dielectric region.

2. The measurement apparatus of claim 1, wherein the central conductive pin is capacitively coupled to a circuit carrying the radio-frequency signal.

3. The measurement apparatus of claim 1, further comprising a threaded barrel, wherein the probe is removably affixed to the lid at the site of the penetration by threads of the threaded barrel.

4. The measurement apparatus of claim 1, wherein the lid comprises an interior surface and an exterior surface and wherein the central conductive pin extends beyond the interior surface and beyond the exterior surface.

5. The measurement apparatus of claim 1, wherein the outer conductive housing extends beyond the exterior surface but not beyond the interior surface.

6. The measurement apparatus of claim 1, wherein the lid further comprises a second penetration of the one more penetrations, and wherein the second penetration is configured to receive a bolt for affixing the lid to the case.

7. A method of transmitting a radio-frequency electrical signal, the method comprising:
   removably affixing a lid to a case, wherein the case houses a circuit;
   inserting a signal-conducting probe through a penetration of the lid, wherein
      after insertion, a central conductive pin of the signal-conducting probe sits within an inductive signal transmission range of a test point on the circuit, and
      the central conductive pin does not touch the circuit; and
   transmitting to a measurement device outside the case a radio-frequency signal inductively received from the test point on the circuit.

8. The method of claim 7, further comprising
   removing the lid from the case;
   attaching the lid to a second case; and
   transmitting to the measurement device outside the case a radio-frequency signal inductively received from a test point on a second circuit.

9. The method of claim 7, further comprising characterizing the probe by measuring a frequency response to an input signal for the circuit.

10. The method of claim 7, wherein the removably affixing the lid to the case further comprises securing the lid by inserting a bolt through a second penetration of the lid.

11. The method of claim 7, wherein the inserting the signal-conducting probe through the penetration of the lid further comprises screwing the signal-conducting probe into the penetration using threads arranged on an outer conductor of the signal-conducting probe.

12. The method of claim 7, wherein the inserting the signal-conducting probe through the penetration of the lid further comprises pushing the signal-conducting probe into a friction-fit well formed by the penetration.

13. The method of claim 7, further comprising determining whether the circuit is in working order by measuring the signal transmitted to the measurement device.

14. A method for fabricating a measurement apparatus, the method comprising:
   fabricating a lid with dimensions configured for the lid to be removably affixed to a case;
   creating one or more penetrations through the lid;
   fabricating a probe by inserting a central conductive pin through a dielectric region surrounded by an outer conductive housing such that
      the central conductive pin is electrically isolated from the outer conductive housing by the dielectric region, and
      the outer conductive housing is dimensioned for insertion into a penetration of the one or more penetrations;
   inserting the signal-conducting probe through the penetration of the one or more penetrations, wherein
      the inserting comprises removably affixing the signal-conducting probe to the lid at the site of the penetration; and
   trimming the central conductive pin at a length such that the central conductive pin is dimensioned to extend at full insertion of the probe within an inductive signal transmission range of a test point on a circuit inside the case without touching the circuit.

15. The method of claim 14, wherein the fabricating the probe further comprises inserting the central conductive pin at a position to connect to an external connector outside the case.

16. The method of claim 14, wherein the fabricating the probe further comprises threading the outer conductive housing.

17. The method of claim 14, wherein the fabricating the probe further comprises generating a dielectric region that extends beyond neither an outer surface nor an inner surface of the lid at the full insertion.

18. The method of claim 14, wherein the fabricating the probe further comprises fabricating the outer conductive surface such that the outer conductive surface provides a connection surface to which to removably affix a signal connector.

19. The method of claim 14, further comprising fabricating a spacer for storing the lid with the probe inserted.

20. A measurement apparatus, the measurement apparatus comprising:
   a lid, wherein the lid comprises one or more penetrations through the lid; and
   a signal-conducting probe insertable through a penetration of the one or more penetrations, wherein
      the probe is removably affixed to the lid at the site of the penetration, and
      the probe comprises
         a central conductive pin, wherein the central conductive pin transmits to a connection outside a case to which the lid is removably affixed a radio-frequency signal inductively received from a source inside the case, wherein the central conductive pin is capacitively coupled to a circuit carrying the radio-frequency signal;

a dielectric region radially surrounding a portion of the central conductive pin, and a grounded outer conductive housing radially surrounding the dielectric region and electrically isolated from the central conductive pin by the dielectric region.

* * * * *